(12) United States Patent
Pawlak et al.

(10) Patent No.: US 8,187,959 B2
(45) Date of Patent: May 29, 2012

(54) SEMICONDUCTOR SUBSTRATE WITH SOLID PHASE EPITAXIAL REGROWTH WITH REDUCED JUNCTION LEAKAGE AND METHOD OF PRODUCING SAME

(75) Inventors: Bartlomiej Jan Pawlak, Leuven (BE); Raymond James Duffy, Leuven (BE); Richard Lindsay, Leuven (BE)

(73) Assignee: IMEC, Leuven (BE)

( * ) Notice: Subject to any disclaimer, the term of this patent is extended or adjusted under 35 U.S.C. 154(b) by 1666 days.

(21) Appl. No.: 10/596,612

(22) PCT Filed: Dec. 2, 2004

(86) PCT No.: PCT/IB2004/052644
§ 371 (c)(1),
(2), (4) Date: Jun. 19, 2006

(87) PCT Pub. No.: WO2005/062354
PCT Pub. Date: Jul. 7, 2005

(65) Prior Publication Data
US 2009/0140242 A1    Jun. 4, 2009

(30) Foreign Application Priority Data
Dec. 18, 2003    (EP) .................................... 03104781

(51) Int. Cl.
*H01L 29/12* (2006.01)
*H01L 21/322* (2006.01)

(52) U.S. Cl. ................. 438/527; 438/529; 257/E29.068; 257/E21.318

(58) Field of Classification Search .................. 438/527, 438/529
See application file for complete search history.

(56) References Cited

U.S. PATENT DOCUMENTS

| | | | | |
|---|---|---|---|---|
| 5,223,445 A * | 6/1993 | Fuse | | 438/302 |
| 5,858,864 A * | 1/1999 | Aronowitz et al. | | 438/528 |
| 6,063,682 A * | 5/2000 | Sultan et al. | | 438/305 |
| 6,074,937 A * | 6/2000 | Pramanick et al. | | 438/528 |
| 6,251,757 B1 * | 6/2001 | Yu | | 438/528 |
| 6,362,063 B1 * | 3/2002 | Maszara et al. | | 438/307 |
| 6,372,591 B1 * | 4/2002 | Mineji et al. | | 438/305 |
| 6,432,802 B1 * | 8/2002 | Noda et al. | | 438/585 |
| 6,521,502 B1 * | 2/2003 | Yu | | 438/305 |
| 6,555,439 B1 * | 4/2003 | Xiang et al. | | 438/308 |
| 6,645,838 B1 * | 11/2003 | Talwar et al. | | 438/530 |
| 7,112,516 B2 * | 9/2006 | Chakravarthi et al. | | 438/486 |
| 2004/0072394 A1 * | 4/2004 | Noda | | 438/163 |
| 2004/0235280 A1 * | 11/2004 | Keys et al. | | 438/528 |
| 2005/0054173 A1 * | 3/2005 | Wang et al. | | 438/369 |
| 2009/0256146 A1 * | 10/2009 | Pawlak | | 257/43 |

* cited by examiner

*Primary Examiner* — Alexander Ghyka
(74) *Attorney, Agent, or Firm* — Knobbe, Martens, Olson & Bear LLP

(57) ABSTRACT

Method of producing a semiconductor device, comprising: a) providing a semiconductor substrate, b) making a first amorphous layer in a top layer of the semiconductor substrate by a suitable implant, the first amorphous layer having a first depth, c) implanting a first dopant into the semiconductor substrate to provide the first amorphous layer with a first doping profile, d) applying a first solid phase epitaxial regrowth action to partially regrow the first amorphous layer and form a second amorphous layer having a second depth that is less than the first depth and activate the first dopant, e) implanting a second dopant into the semiconductor substrate to provide the second amorphous layer with a second doping profile with a higher doping concentration than the first doping profile, f) applying a second solid phase epitaxial regrowth action to regrow the second amorphous layer and activate the second dopant.

7 Claims, 3 Drawing Sheets

SEMICONDUCTOR SUBSTRATE WITH SOLID PHASE EPITAXIAL REGROWTH WITH REDUCED JUNCTION LEAKAGE AND METHOD OF PRODUCING SAME

The present invention relates to a method of producing a semiconductor device in which use is made of a solid phase epitaxial regrowth technique to produce shallow junctions.

The technique of SPER is disclosed a.o., by U.S. Pat. No. 6,063,682. According to this prior art document, heavy ions are implanted into a silicon substrate. The implanted heavy ions create an amorphous layer at the top surface of the substrate. The amorphous layer is free of channels. Then, a silicon implanting step is performed to create an excess of vacancies compared to interstitials within a top layer of the substrate. Since the amorphized silicon layer is free of channels, the depth of implant is mainly restricted to this amorphized silicon layer.

One of the most promising approaches for future generations of CMOS technology nodes is low temperature processing. This is due to a few reasons, such as metal gate and junction formation that require a reduced thermal budget. Ultra-shallow (source and drain extensions) junctions formed by Solid Phase Epitaxial Regrowth (SPER) can be obtained with good metastable B activation, limited dopant diffusion and excellent abruptness. Typical temperatures used for the junction regrowth are between T=550° C. and T=750° C. Processing at these low temperatures does not remove the post-implantation damage completely and therefore such junctions suffer from a higher leakage current. Deep Level Transient Spectroscopy (DLTS) studies prove that the typical defects are positioned 0.457 eV below the conduction band.

However, together with high dopant activation levels in the junction and excellent abruptness of the junction a dramatic increment of band-to-band leakage current has been observed.

Therefore it is an object of the present invention to provide a method of producing a semiconductor device as stated at the outset that reduces the leakage current of the junction.

To obtain this object, the present invention provides a method of producing a semiconductor device comprising:
a) providing a semiconductor substrate,
b) making a first amorphous layer in a top layer of the semiconductor substrate by a suitable implant, the first amorphous layer having a first depth,
c) implanting a first dopant into the semiconductor substrate to provide the first amorphous layer with a first doping profile,
d) applying a first solid phase epitaxial regrowth action to partially regrow the first amorphous layer and form a second amorphous layer having a second depth that is less than the first depth and activate the first dopant,
e) implanting a second dopant into the semiconductor substrate to provide the second amorphous layer with a second doping profile with a higher doping concentration than the first doping profile,
f) applying a second solid phase epitaxial regrowth action to regrow the second amorphous layer and activate the second dopant.

By this method, a semiconductor substrate is provided that has two shallow areas close to the surface of the substrate. A first area that is located adjacent to the top surface of the substrate has a higher doping level than the second area that is adjacent to the first area and extends into the substrate. This second area can be made even more shallow than the first area. For instance, the first area adjacent to the surface can have a thickness of 6-12 nm, whereas the second area may have a thickness of 2-4 nm. Due to the differences in doping levels, the leakage current from the first area across the junction can be reduced efficiently.

According to an embodiment of the present invention the method includes, prior to action b), implanting an initial dopant to provide a HALO implant area extending deeper than the first amorphous layer.

In a further embodiment the present invention relates to a semiconductor device made by a solid phase epitaxial regrowth technique, comprising a semiconductor substrate with a first area having a first conductivity profile and a second area having a second conductivity profile, the second area having a thickness of 6-12 nm and being located adjacent to a top surface of the semiconductor substrate, and the first area having a thickness of 2-4 nm and being located adjacent to the second area, the second conductivity profile having a lower conductivity than the first conductivity profile.

Moreover, the invention relates to a metal oxide semiconductor device comprising such a device.

Finally, the invention relates to an apparatus provided with such a semiconductor device.

The present invention will now be illustrated with reference to some drawings, which are only intended to illustrate the present invention and not to limit its scope. The scope is only limited by the definition of the claims as annexed to this description, and its technical equivalents.

In the description to follow, same reference numbers refer to same elements in all Figures. FIGS. 1a-1f refer to producing a metal oxide semiconductor device in which the present invention is used. However, as will be evident to a person skilled in the art, the inventive features may be applied in the production of any other type of semiconductor device where shallow junctions are desired.

Figure 1A:
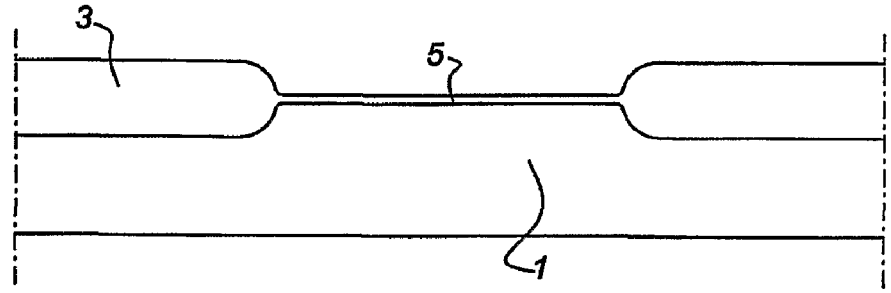
FIGS. 1a-1f show different stages of producing a semiconductor device in accordance with the present invention.
Figure 1B:
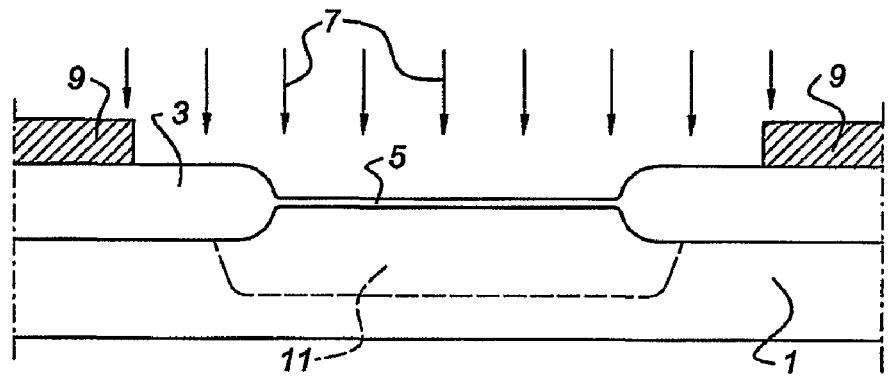

FIG. 1a shows a semiconductor substrate 1 of a p-type. Field oxide regions 3 are provided on a top surface of the semiconductor substrate 1. At certain locations, a thin oxide layer 5 is provided by a technique known to a person skilled in the art. The thin oxide layer 5 can later be used as the gate oxide layer within the MOS device to be produced. However, the present invention is not restricted to the application of a thin oxide layer 5 to obtain the desired effect as will become clear from the description below.

The structure of FIG. 1a is provided with a suitable photoresist layer 30 having an opening above the thin oxide layer 5. Next, an implanting action is performed to produce an n-well 11 within the substrate 1.

Figure 1C:
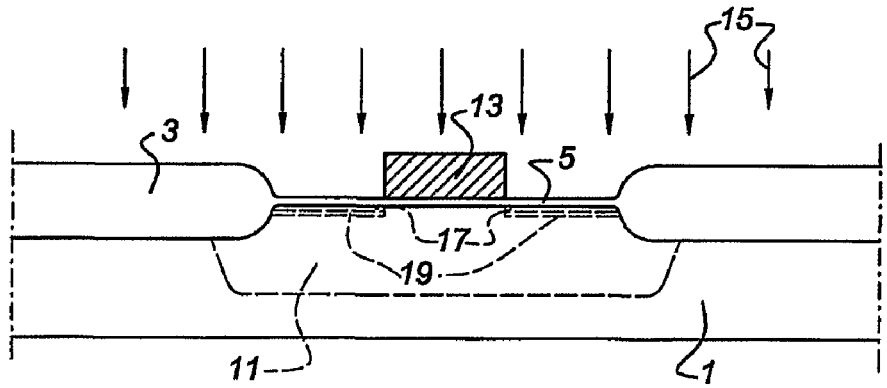

The thin oxide layer 5 may be removed and substituted by a new, fresh oxide layer and used later on as the gate oxide layer in the MOS device to be produced. However, here it is assumed that the thin oxide layer 5 remains in place. As shown in FIG. 1c, on top of the thin oxide layer 5, a polysilicon layer 13 is provided, which is to be used later as the gate of the MOS device to be produced.

An amorphization implant 15 is performed to produce an amorphous layer in the top of the substrate 1. The depth of the implant that defines the depth of the amorphous layer is indicated by means of reference number 17. The implant 15 to produce this amorphous layer may be performed using Ge, GeF$_2$ or Si. However, other atoms, like indium, may be applied instead. By this implant, the channels in the silicon substrate 1 are eliminated in the amorphous layer.

This step of producing the amorphous layer is followed by a subsequent dopant implant, e.g., with boron (B), phosphorus (P), arsenic (As) or indium (In). Since there are no channels within the amorphous layer, the dopant implant atoms, like boron, will penetrate the silicon substrate 1 to a depth only slightly below the amorphous layer. The depth of this subsequent dopant implant is indicated by means of reference number 19. It is to be understood that the depth of implant 19 is only slightly larger than the depth of the amorphous layer 17. The distances between the dashed line 17 and the top surface, and the distance between the dashed line 19 and the top surface of substrate 1 are not drawn to scale. They are drawn only to illustrate the principle of the present invention.

Figure 2:
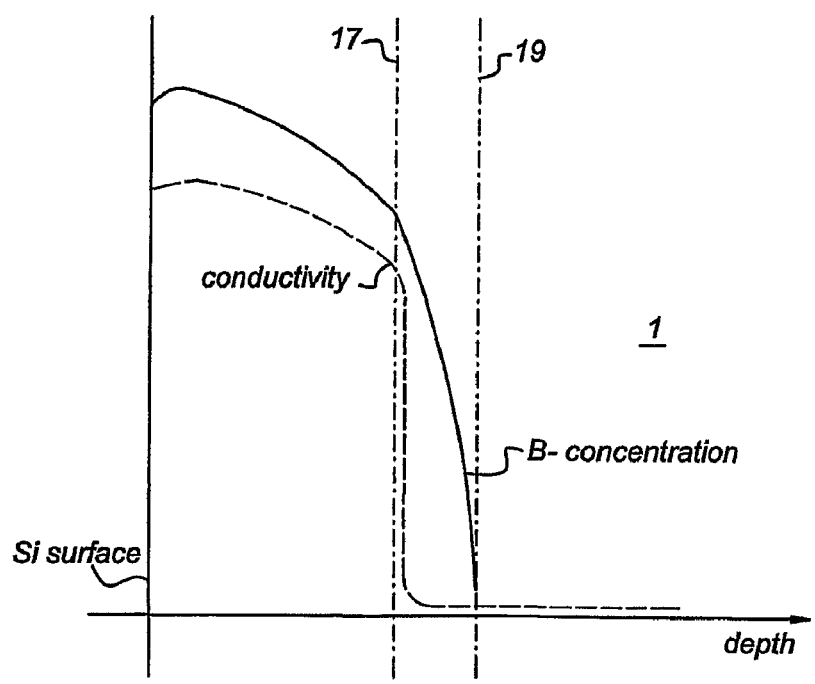
FIG. 2 shows an example of a dopant concentration and a conductivity profile as a function of depth in a semiconductor substrate in accordance with a method known from the prior art.

Now, reference is made to FIG. 2.

FIG. 2 shows the top of the silicon substrate, the depth of the amorphous layer 17 and the depth of the implant of boron (as an example) 19. The boron profile corresponds to the boron profile as shown in prior art document U.S. Pat. No. 6,063,682.

A next action is to apply a so-called low temperature approach, i.e. a solid phase epitaxial regrowth (SPER) technique. In SPER, the silicon crystal is first pre-amorphized, then doped and finally regrown at a temperature typically between 550° C. and 750° C. By this temperature action, the amorphous layer is regrown and the dopant (e.g., boron) is activated. The main advantages of SPER are limited dopant diffusion (hardly beyond the amorphous layer 17) and above solid solubility dopant activation.

However, experiments have shown that the low temperature action of SPER does not remove the post-implantation damage completely. Therefore, junctions made by SPER may suffer from a higher leakage current.

The present invention proposes to solve this problem by the method explained with reference to FIG. 3.

Figure 3:
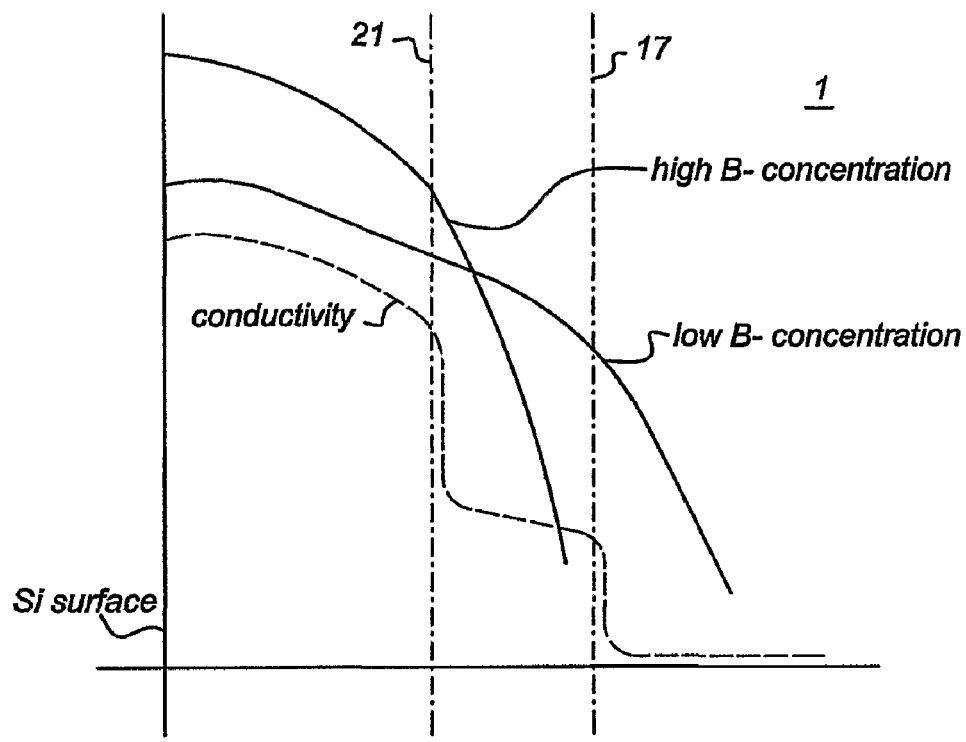
FIG. 3 shows an example of dopant concentrations and a conductivity profile as a function of depth in a semiconductor substrate in accordance with the invention.

FIG. 3 shows the top area of the silicon substrate again. FIG. 3 shows the depth of the amorphous layer 17 on a larger scale than FIG. 2.

The amorphous layer 17 may be produced by implanting with at least one of Ge, GeF$_2$, Si, Ar or Xe atoms. When Ge is used a typical energy may be between 2-30 keV and a typical dose may be $10^{15}$ atoms/cm$^2$. Other energies or doses may be used.

Next, the semiconductor substrate 1 is implanted with a dopant, e.g. B, with a rather low energy. When B is implanted, such a low energy may typically be between 3-10 keV. Then the dose may typically be of the order of $10^{14}$ atoms/cm$^2$. A B-doping concentration indicated as "low B-concentration" results. P, As or In may be used instead of B.

Subsequently, in accordance with the present invention the amorphous layer 17 is not entirely regrown by means of a SPER technique but only partially. That is to say, the SPER process applied at a temperature of typically between 550° C. and 750° C. is performed during a few seconds only. By this SPER process, a layer of 2-6 nm can be created with only lowly active B. Only a portion of the earlier layer 17 remains amorphous, as indicated by means of a dashed line 21. That is to say, the substrate is regrown from dashed line 17 to dashed line 21, whereas an amorphous layer remains between dashed line 21 and the semiconductor surface. The depth from the semiconductor surface to dashed line 21 may be 6-12 nm.

Next, a further dopant implantation follows, e.g., again using B. The energy may typically range between 0.5 and 3 keV. A typical dose may be of the order of $10^{15}$ atoms/cm$^2$. These B-atoms will, typically, not be implanted deeper than the depth of the remaining amorphous layer, i.e. up to dashed line 21. P, As or In may be used instead of B.

Only after this action, the remaining portion of the amorphous layer 21 is regrown entirely. Again this is done by a SPER process. Typical temperatures again range between 550° C. and 750° C. However, a typical time needed is of the order of 1 minute.

Thus, a top area adjacent the semiconductor surface results having two combined dopant concentrations, i.e. in a first region adjacent to the semiconductor surface there is a higher doping level than in a second region adjacent to the first region. The second region between the dashed lines 21 and 17 has a lower doping level than the first region between the semiconductor surface and the dashed line 21. After the completion of this action, a conductivity profile results, as indicated in FIG. 3, which has a higher conductivity in the region between the semiconductor surface and the dashed line 21 than in the region between the dashed line 21 and the dashed line 17.

Experiments have shown that, after completion of the structure shown in FIG. 3, the higher the activation level of the dopant in the region between dashed lines 21 and 17, the lower the leakage reduction is. For example, a typical activation level in the region between dashed lines 21 and 17 may be $6.5 \times 10^{19}$ B at/cm$^3$. However, at the same time, investigations have shown that there is no further improvement if the width of the area between the dashed lines 21 and 17 exceeds 6 nm.

As will be explained below, the region between the semiconductor surface and dashed line 17 will eventually form source/drain extensions of a transistor. By the method described above, the doping of this region can still be highly activated, which makes it possible to tune the on/off current of the transistor comprising such source/drain extensions. In other words, there is good control over the transistor channel region to be produced.

Now, with reference to FIGS. 1*d*-1*f*, the completion of the semiconductor device to be produced will be explained.

Figure 1D:
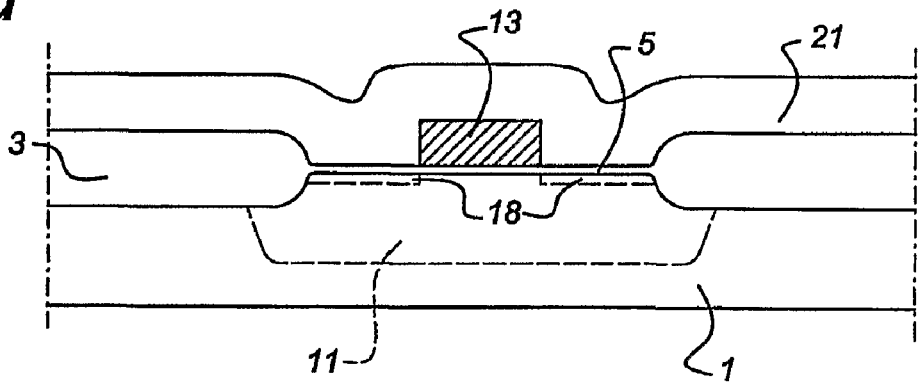
Figure 1E:
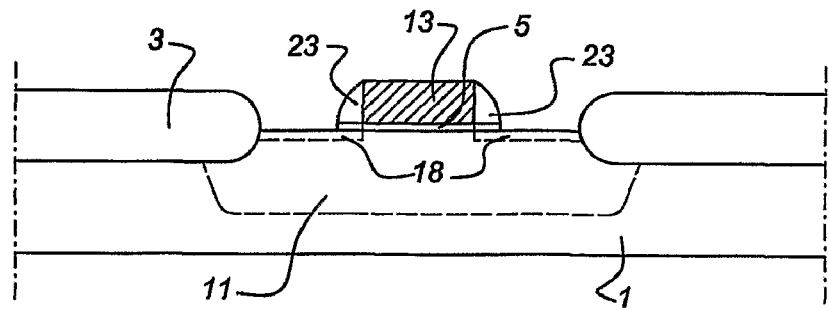

As shown in FIG. 1*d*, after the SPER process, lightly doped regions 18 result that will become source/drain extension regions of the MOS transistor on the substrate 1. The depth of these doped regions 18 will be substantially equal to the depth of the earlier amorphous layer 17.

On top of the structure, a spacer material 21 is deposited. The spacer material 21 may be silicon dioxide. However, other spacer materials may be used, as is known to a person skilled in the art.

The spacer material 21 is etched with a suitable etchant in such a manner that only side spacers 23 adjacent to the polysilicon layer 13 remain. See FIG. 1*e*. This is all prior art and needs no further explanation here. It is noted that, due to the etch process, only a portion of the thin oxide layer 5 remains, i.e. the portion below the polysilicon layer 13 and the portions below the side spacers 23. The portions of the thin oxide layer 5 that are situated elsewhere are removed by the etch process.

Figure 1F:
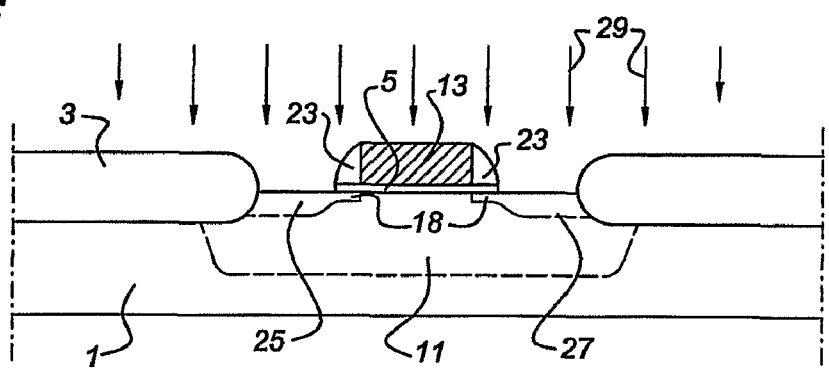

A further ion implant action is performed as shown in FIG. 1*f*. In the embodiment shown, this is a p$^+$ implant 29 to produce a p$^+$ source region 27 and a p$^+$ drain region 152. These source and drain regions 27, 25 extend deeper into the substrate 1 than the previously doped regions 18. The side spacers 23 act as a mask to protect portions of the previously doped regions 18 from this latter p⁺ implant 29. Thus, extension regions 18 remain after this action.

As is known to a person skilled in the art, the manufacture of the MOS device is completed by, e.g., providing a suitable silicide process to form silicide on the drain 25, the source 27 and the polysilicon layer 13 which acts as a gate. This latter silicide process is known to a person skilled in the art and is not shown in FIG. 1f.

As will be evident to persons skilled in the art, the present invention is not limited to the example given above.

For example, to implant the dopant both before and after the partial regrowth of the amorphous layer the presence of an insulating layer 5 on the semiconductor substrate surface is not required.

Figure 4:
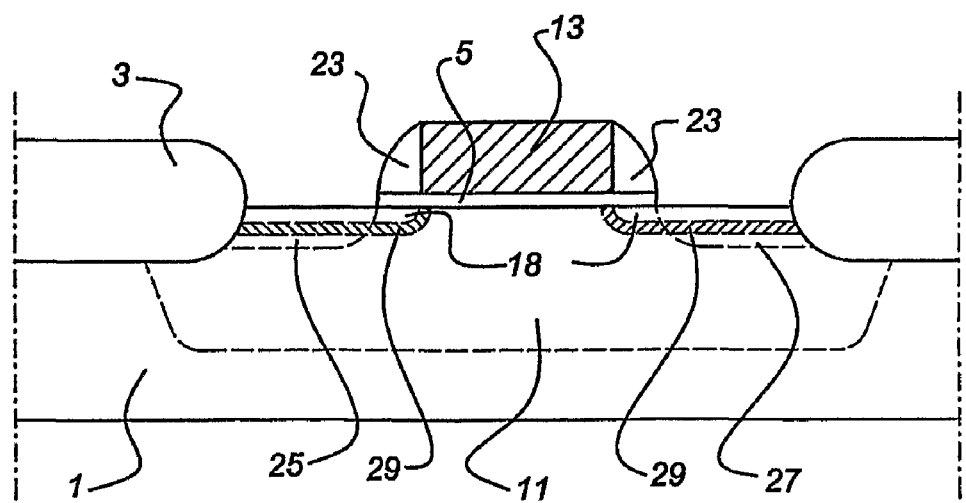
FIG. 4 shows a semiconductor device manufactured in accordance with the present invention.

Moreover, the present invention has been illustrated with dopants comprising B to produce p-type extensions for source and drain regions. However, other types of dopants will be used if one wishes to produce an n-type extension. Moreover, as will be evident to persons skilled in the art, there may be HALO background areas extending deeper into the substrate 1 than the extensions 18. FIG. 4 shows such HALO background areas 29 which extend deeper into the substrate 1 than the extension areas 18 but less deep than the source and drain regions 27 and 25, respectively. Such HALO regions are known to persons skilled in the art and need no further explanation here. To produce these HALO regions 29, the substrate 1 is implanted with dopants of a conductivity type opposite to the conductivity type of the dopant used to produce the extension regions 18 and 19 and the source and drain regions 27, 25. This implantation for the halo regions 29 is performed prior to producing the amorphous layer 17 shown in FIG. 1c and FIG. 3.

A desired transistor performance can be obtained by applying an optimum combination of activation levels in the extension regions 18, i.e. both in the region between the semiconductor substrate surface and the dashed line 21 and in the region between the dashed lines 21 and 17, as well as in the HALO regions 29 and the width of the regions shown in FIG. 3.

The invention claimed is:

1. Method of producing a semiconductor device comprising:
    a) providing a semiconductor substrate,
    b) making a first amorphous layer in a top layer of said semiconductor substrate by a suitable implant, said first amorphous layer having a first depth,
    c) implanting a first dopant into said semiconductor substrate to provide said first amorphous layer with a first doping profile,
    d) applying a first solid phase epitaxial regrowth action to partially regrow said first amorphous layer and form a second amorphous layer having a second depth that is less than said first depth and activate said first dopant,
    e) implanting a second dopant into said semiconductor substrate to provide said second amorphous layer with a second doping profile with a higher doping concentration than said first doping profile,
    f) applying a second solid phase epitaxial regrowth action to regrow said second amorphous layer and activate said second dopant.

2. Method according to claim 1, wherein said semiconductor substrate is a Si substrate and action b) is performed with at least one of Ge, GeF$_2$, Si, Ar or Xe atoms.

3. Method according to claim 2, wherein said action b) is performed with Ge in a dose of $10^{15}$ atoms/cm$^2$ and an energy between 2 and 30 keV.

4. Method according to claim 1, wherein said action c) is performed with at least one of B, P, As and In at an energy between 3 and 10 keV, and a dose of $10^{14}$ atoms/cm$^2$.

5. Method according to claim 1, wherein action d) is performed at a temperature of 550-750° C. during a few seconds.

6. Method according to claim 1, wherein said action e) is performed with at least one of B, P, As and In at an energy between 0.5 and 3 keV, and a dose of $10^{15}$ atoms/cm$^2$.

7. Method according to claim 1, wherein prior to said action b), an initial dopant is implanted to provide a HALO implant area extending deeper than said first amorphous layer.

* * * * *